United States Patent
Tsien et al.

(10) Patent No.: US 12,174,747 B2
(45) Date of Patent: Dec. 24, 2024

(54) LAST LEVEL CACHE ACCESS DURING NON-CSTATE SELF REFRESH

(71) Applicant: Advanced Micro Devices, Inc., Santa Clara, CA (US)

(72) Inventors: Benjamin Tsien, Fremont, CA (US); Chintan S. Patel, San Antonio, TX (US); Guhan Krishnan, Acton, MA (US); Andrew William Lueck, Austin, TX (US); Sreenath Thangarajan, Chennai (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/556,617

(22) Filed: Dec. 20, 2021

(65) Prior Publication Data
US 2023/0195644 A1 Jun. 22, 2023

(51) Int. Cl.
*G06F 12/0897* (2016.01)
(52) U.S. Cl.
CPC ...... *G06F 12/0897* (2013.01); *G06F 2212/60* (2013.01)
(58) Field of Classification Search
None
See application file for complete search history.

(56) References Cited

U.S. PATENT DOCUMENTS

| | | | |
|---|---|---|---|
| 7,143,203 B1 | 11/2006 | Altmejd | |
| 9,298,243 B2 | 3/2016 | Jain et al. | |
| 2001/0040827 A1* | 11/2001 | Dosaka | G11C 11/4097 365/189.011 |
| 2007/0113015 A1* | 5/2007 | Moll | G06F 12/0802 711/135 |
| 2014/0152678 A1 | 5/2014 | Sharma | |
| 2014/0173207 A1* | 6/2014 | Wang | G06F 12/0802 711/122 |
| 2014/0181410 A1* | 6/2014 | Kalamatianos | G06F 12/121 711/133 |
| 2014/0195737 A1* | 7/2014 | Lilly | G06F 12/0811 711/119 |

(Continued)

OTHER PUBLICATIONS

"OMAP35x Applications Processor"; reference manual; Texas Instruments; 12500 Ti Blvd, Dallas, TX, 75243, USA; Literature No. SPRUF980; Apr. 2010; Rev. Feb. 2011; 24 pages.

(Continued)

*Primary Examiner* — Stephanie Wu
(74) *Attorney, Agent, or Firm* — Polansky & Associates, P.L.L.C.; Paul J. Polansky; Nathan H. Calvert

(57) ABSTRACT

A data processor includes a data fabric, a memory controller, a last level cache, and a traffic monitor. The data fabric is for routing requests between a plurality of requestors and a plurality of responders. The memory controller is for accessing a volatile memory. The last level cache is coupled between the memory controller and the data fabric. The traffic monitor is coupled to the last level cache and operable to monitor traffic between the last level cache and the memory controller, and based on detecting an idle condition in the monitored traffic, to cause the memory controller to command the volatile memory to enter self-refresh mode while the last level cache maintains an operational power state and responds to cache hits over the data fabric.

19 Claims, 7 Drawing Sheets

| C-state | DF | UMC | PHY | DRAM | UMC CLK | DF CLK |
|---|---|---|---|---|---|---|
| Lightweight (DFC1) | Clock gating | Clock gating | Powered on with PLL remain locked | Self refresh | PLL deep sleep | PLL deep sleep |
| Traditional (DFC2) | Power and clock gating | Power and clock gating | PHY low power state with PLL off (LP2) | Self refresh | PLL power down and bypass to REFCLK | PLL power down and bypass to REFCLK |
| UMC Preemptive C1 | Operational | Clock gating | Powered on with PLL remain locked | Self refresh | PLL deep sleep | Operational |
| UMC Preemptive C2 | Operational | Power and clock gating | PHY low power state with PLL off (LP2) | Self refresh | PLL power down and bypass to REFCLK | Operational |

(56) References Cited

U.S. PATENT DOCUMENTS

| | | | |
|---|---|---|---|
| 2014/0298058 A1* | 10/2014 | Klingauf | G06F 1/3296 |
| | | | 713/322 |
| 2017/0038999 A1* | 2/2017 | Vanka | G06F 3/0625 |
| 2017/0277460 A1 | 9/2017 | Li et al. | |
| 2017/0277461 A1* | 9/2017 | Li | G06F 3/0685 |
| 2017/0316818 A1 | 11/2017 | Saifuddin et al. | |
| 2019/0147926 A1* | 5/2019 | Branover | G06F 1/3253 |
| | | | 327/158 |
| 2020/0348746 A1* | 11/2020 | Phoenix | G06F 1/3275 |
| 2023/0029696 A1* | 2/2023 | Bhat | G06F 12/0864 |

OTHER PUBLICATIONS

"RZ/G Series User's Manual: Hardware for Rich Graphics Applications"; manual; Renesas Electronics Corp.; Toyosu Foresia, Mar. 2, 24 Toyosu, Koto-ku, Tokyo, 135-0061, Japan; Rev. 1.00; Sep. 2016; 144 pages.

International Search Report and Written Opinion for International Application No. PCT/US2022/052266 mailed May 4, 2023, 9 pages.

\* cited by examiner

| C-state | DF | UMC | PHY | DRAM | UMC CLK | DF CLK |
|---|---|---|---|---|---|---|
| Lightweight (DFC1) | Clock gating | Clock gating | Powered on with PLL remain locked | Self refresh | PLL deep sleep | PLL deep sleep |
| Traditional (DFC2) | Power and clock gating | Power and clock gating | PHY low power state with PLL off (LP2) | Self refresh | PLL power down and bypass to REFCLK | PLL power down and bypass to REFCLK |
| UMC Preemptive C1 | Operational | Clock gating | Powered on with PLL remain locked | Self refresh | PLL deep sleep | Operational |
| UMC Preemptive C2 | Operational | Power and clock gating | PHY low power state with PLL off (LP2) | Self refresh | PLL power down and bypass to REFCLK | Operational |

FIG. 4

LAST LEVEL CACHE ACCESS DURING NON-CSTATE SELF REFRESH

BACKGROUND

Computer systems utilize a variety of peripheral components for different input/output and communication functions. A system-on-chip (SOC) combines data processing circuits such as central processing unit (CPU) cores and a graphics processing unit (GPU) with peripheral controllers and memory interfaces on single integrated circuit chip and is well-suited for portable, battery-powered operation. For example, an SOC could incorporate a display controller, an image signal processor (ISP), and other peripheral controllers on the SOC to enable the input and output of information to and from the computer system. In such large and complex SOCs, the devices typically transfer data between resources such as memory by routing accesses through a large, on-chip routing circuit or "data fabric".

The diversity of the circuits on a typical SOC presents problems for implementing power-saving modes. Many of the peripheral controllers operate real-time and are isochronous, requiring a certain amount of bandwidth to shared memory resources over a certain period of time. This requirement has frustrated the implementation of chip-wide low-power states. For example, when the CPU cores and the GPU are idle, a peripheral controller may still be active and receiving data that it can store in a buffer, but must send the data to memory before the buffer fills up.

CPUs and GPUs, on the other hand, tend to have periods of high activity separated by idle periods. When the idle periods are expected to be short, the data fabric, memory controllers, and memories typically remain active so they can quickly service requests from the peripheral controllers to transfer more data.

BRIEF DESCRIPTION OF THE DRAWINGS

FIG. 4 shows a table showing the correspondence between different data fabric idle states and the states of other components of SOC of FIG. 2;

Figure 1:
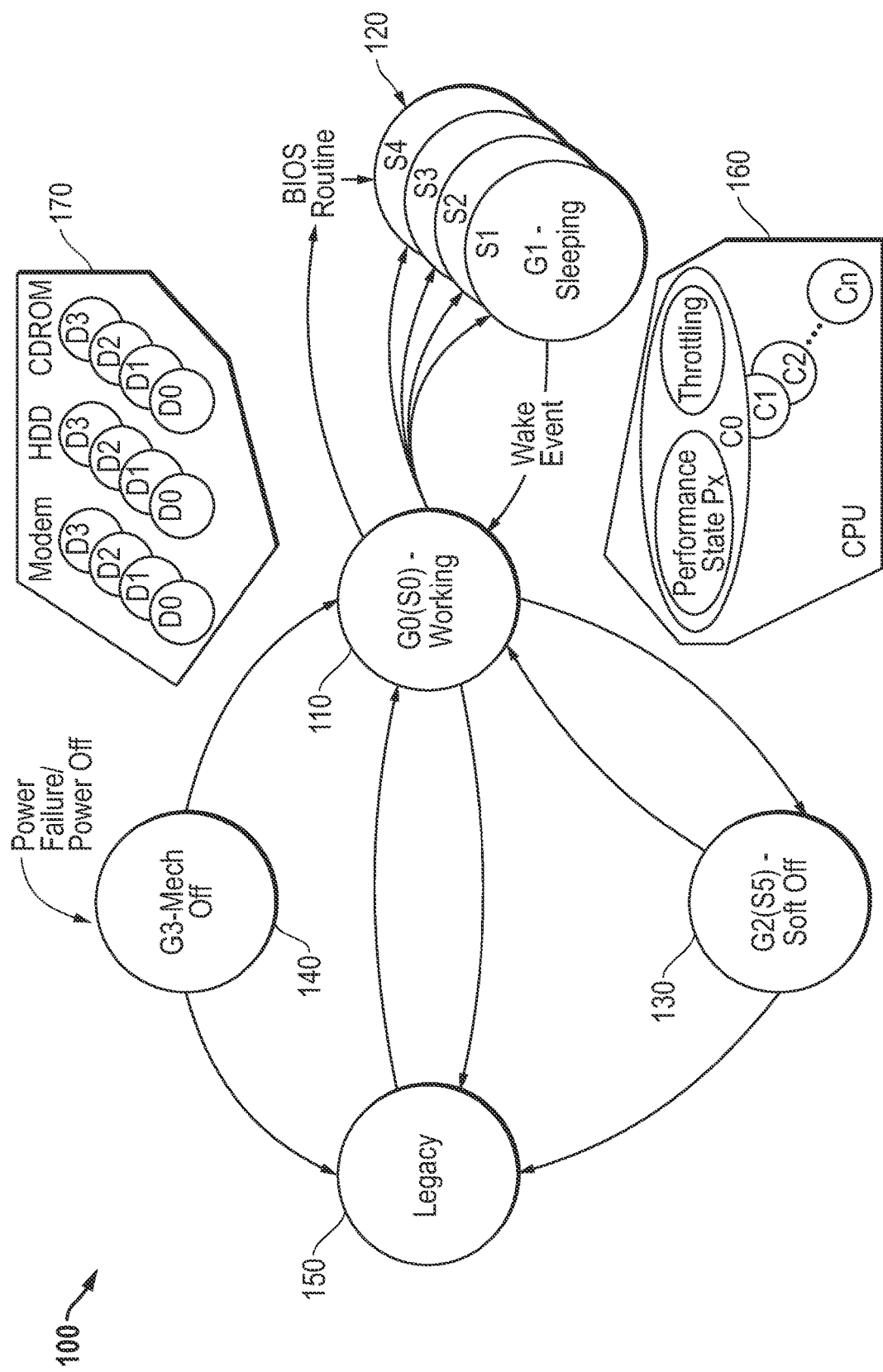
FIG. 1 illustrates in block diagram form an Advanced Configuration and Power Interface (ACPI) model for computer system power states known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data processor includes a data fabric, a memory controller, a last level cache, and a traffic monitor. The data fabric is for routing requests between a plurality of requestors and a plurality of responders. The memory controller is for accessing a volatile memory. The last level cache is coupled between the memory controller and the data fabric. The traffic monitor is coupled to the last level cache and operable to monitor traffic between the last level cache and the memory controller, and based on detecting an idle condition in the monitored traffic, to cause the memory controller to command the volatile memory to enter self-refresh mode while the last level cache maintains an operational power state and responds to cache hits over the data fabric.

A method includes, at a data fabric of a data processor, routing requests between a plurality of requestors and a plurality of responders. At a last level cache coupled to the data fabric, the method includes monitoring traffic to a volatile memory. Based on detecting an idle condition in the monitored traffic, the method includes causing a memory controller to command the volatile memory to enter self-refresh mode while the last level cache maintains an operational power state and responds to cache hits over the data fabric.

A traffic monitor for a last level cache includes a traffic monitor circuit for monitoring traffic between the last level cache and a memory controller, and based on detecting an idle condition in the monitored traffic, causing the memory controller to command a volatile memory to enter self-refresh mode. The last level cache maintains an operational power state and responds to cache hits over a data fabric while the volatile memory is in the self-refresh mode.

FIG. 1 illustrates in block diagram form an Advanced Configuration and Power Interface (ACPI) model 100 for computer system power states known in the prior art. ACPI model 100 is part of the APCI Specification developed by various computer system, software, and component vendors to establish industry standard interfaces for device configuration and power management of both devices and entire computer systems.

ACPI model 100 defines a hierarchy of states of various devices in the computer system organized around a set of global system states including a G0(S0) state 110 known as the "Working" state, a G1 state 120 state known as the "Sleeping" state, a G2(S5) state 130 known as the "Soft Off" state, and a G3 state 140 known as "Mechanical Off" state. In addition, ACPI model 100 includes a state 150 known as the "Legacy" state that accommodates pre-existing basic input/output system (BIOS) power management interfaces that correspond to BIOS operation before a ACPI-compatible operating system loads. ACPI model 100 also defines a set of central processing unit (CPU) states 160, and a set of device states or "D" states 170 for devices such as modems, hard disk drives (HDDs), and compact disc read only memories (CDROMs).

ACPI model 100 is well-known and most aspects will not be discussed further. However certain aspects relating to power states of the central processing unit are relevant to understanding the present disclosure and will now be discussed.

In G0(S0) state 110, peripheral devices can have their power state changed dynamically, while the user can select, through a user interface, various performance and power characteristics of the system so that the software system can optimize the computer for the desired performance or battery life. In this state, the computer system responds to external events in real time. From the G0(S0) state, the computer system can transition to G1 state 120, which includes various power-saving sleeping states or "S-states" under the control of system firmware such as the BIOS, and return to the working state in response to a wake event.

In G0(S0) state 110, the CPU is capable of operating in various states including a "C0" state in which the processor executes instructions, as well as various lower power or "idle" states labeled "C1" through "Cn". In the C0 state, the CPU is capable of operating in various performance states or "P-states", in which the frequency of operation can be increased or throttled to support the needs of currently-running application programs using dynamic voltage and frequency scaling (DVFS). In idle states C1-Cn, the CPU is idle and does not execute instructions but has various combinations of power consumption and wakeup latency, in which lower power consumption is traded off with longer wakeup latency. So for example, in the C1 state, power consumption is the highest but wakeup latency is the shortest, whereas in the Cn state power consumption is the lowest but wakeup latency is the longest.

Using ACPI model 100, each particular computer system may support different combinations of P-states and C-states as appropriate for the application environment. Achieving better tradeoffs between reduced power consumption and low latency in ways not specified by ACPI model 100 continues to be a desirable goal.

Figure 2:
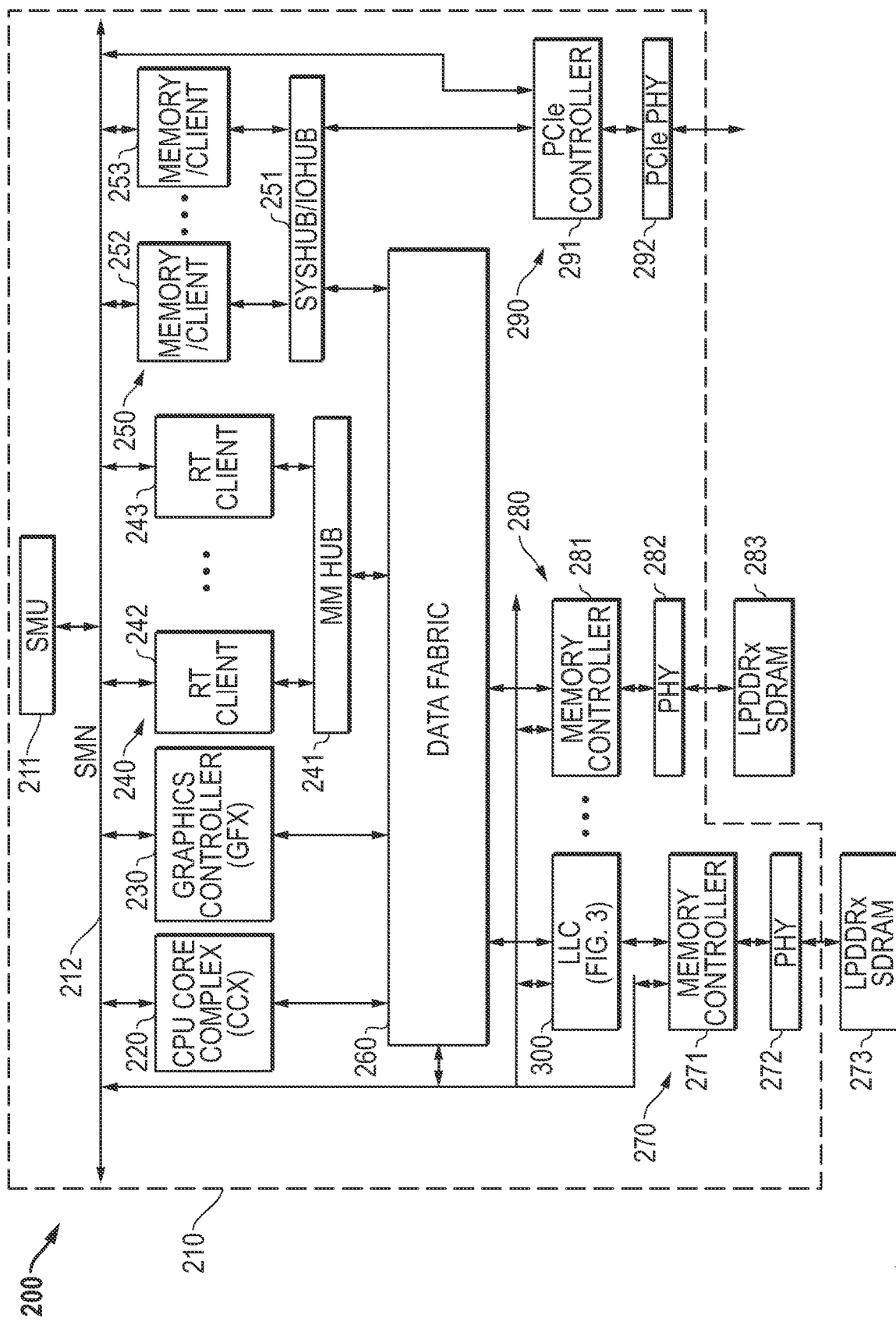
FIG. 2 illustrates in block diagram form a data processing system according to some embodiments.

FIG. 2 illustrates in block diagram form a data processing system 200 according to some embodiments. Data processing system 200 includes a data processor in the form of an SOC 210 and external memory in the form of low-power Double Data Rate synchronous dynamic random-access memories (LPDDRx SDRAMs) 273 and 283. Many other components of an actual data processing system are typically present but are not relevant to understanding the present disclosure and are not shown in FIG. 2 for ease of illustration.

SOC 210 includes generally a system management unit (SMU) 211, a system management network (SMN) 212, a central processing unit (CPU) core complex 220 labeled "CCX", a graphics controller 230 labeled "GFX", a real-time client subsystem 240, a memory/client subsystem 250, a data fabric 260, memory channels 270 and 280, a Peripheral Component Interface Express (PCIe) subsystem 290, and a last-level cache 300 labeled "LLC". As will be appreciated by a person of ordinary skill, SOC 210 may not have all of these elements present in every embodiment and, further, may have additional elements included therein.

SMU 211 is bidirectionally connected to the major components in SOC 210 over SMN 212. SMN 212 forms a control fabric for SOC 210. SMU 211 is a local controller that controls the operation of the resources on SOC 210 and synchronizes communication among them. SMU 211 manages power-up sequencing of the various processors on SOC 210 and controls multiple off-chip devices via reset, enable and other signals. SMU 211 includes one or more clock sources (not shown), such as a phase locked loop (PLL), to provide clock signals for each of the components of SOC 210. SMU 211 also manages power for the various processors and other functional blocks, and may receive measured power consumption values from CPU cores in CPU core complex 220 and graphics controller 230 to determine appropriate P-states.

CPU core complex 220 includes a set of CPU cores, each of which is bidirectionally connected to SMU 211 over SMN 212. Each CPU core may be a unitary core only sharing a last-level cache with the other CPU cores, or may be combined with some but not all of the other cores in clusters.

Graphics controller 230 is bidirectionally connected to SMU 211 over SMN 212. Graphics controller 230 is a high-performance graphics processing unit capable of performing graphics operations such as vertex processing, fragment processing, shading, texture blending, and the like in a highly integrated and parallel fashion. In order to perform its operations, graphics controller 230 requires periodic access to external memory. In the embodiment shown in FIG. 2, graphics controller 230 shares a common memory subsystem with CPU cores in CPU core complex 220, an architecture known as a unified memory architecture. Because SOC 210 includes both a CPU and a GPU, it is also referred to as an accelerated processing unit (APU).

Real-time client subsystem 240 includes a set of real-time clients such as representative real time clients 242 and 243, and a memory management hub 241 labeled "MM HUB". Each real-time client is bidirectionally connected to SMU 211 over SMN 212, and to memory management hub 241. Real-time clients could be any type of peripheral controller that require periodic movement of data, such as an image signal processor (ISP), an audio coder-decoder (codec), a display controller that renders and rasterizes objects generated by graphics controller 230 for display on a monitor, and the like.

Memory/client subsystem 250 includes a set of memory elements or peripheral controllers such as representative memory/client devices 252 and 253, and a system and input/output hub 251 labeled "SYSHUB/IOHUB". Each memory/client device is bidirectionally connected to SMU 211 over SMN 212, and to system and input/output hub 251. Memory/client devices are circuits that either store data or require access to data on an aperiodic fashion, such as a non-volatile memory, a static random-access memory (SRAM), an external disk controller such as a Serial Advanced Technology Attachment (SATA) interface controller, a universal serial bus (USB) controller, a system management hub, and the like.

Data fabric 260 is an interconnect that controls the flow of traffic in SOC 210. Data fabric 260 is bidirectionally connected to SMU 211 over SMN 212, and is bidirectionally connected to CPU core complex 220, graphics controller 230, memory management hub 241, system and input/output hub 251. Data fabric 260 includes a crossbar switch for routing memory-mapped access requests and responses between any of the various devices of SOC 210. It includes a system memory map, defined by a basic input/output system (BIOS), for determining destinations of memory accesses based on the system configuration, as well as buffers for each virtual connection.

Memory channels 270 and 280 are circuits that control the transfer of data to and from external memories 273 and 283. Memory channel 270 is formed by a memory controller 271 and a physical interface circuit 272 labeled "PHY" connected to external memory 273. Memory controller 271 is bidirectionally connected to SMU 211 over SMN 212 and has an upstream port, and a downstream port. Physical interface circuit 272 has an upstream port bidirectionally connected to memory controller 271, and a downstream port bidirectionally connected to external memory 273. Similarly, memory channel 280 is formed by a memory controller 281 and a physical interface circuit 282 connected to external memory 283. Memory controller 281 is bidirectionally connected to SMU 211 over SMN 212 and has an upstream port bidirectionally connected to data fabric 260, and a downstream port. Physical interface circuit 282 has an upstream port bidirectionally connected to memory controller 281, and a downstream port bidirectionally connected to external memory 283.

Peripheral Component Interface Express (PCIe) subsystem 290 includes a PCIe controller 291 and a PCIe physical interface circuit 292. PCIe controller 291 is bidirectionally connected to SMU 211 over SMN 212 and has an upstream port bidirectionally connected to system and input/output hub 251, and a downstream port. PCIe physical interface circuit 292 has an upstream port bidirectionally connected to PCIe controller 291, and a downstream port bidirectionally connected to a PCIe fabric, not shown in FIG. 2. PCIe controller is capable of forming a PCIe root complex of a PCIe system for connection to a PCIe network including PCIe switches, routers, and devices.

LLC 300 is connected between data fabric 260 and memory controller 271. LLC 300 has an upstream port bidirectionally connected to data fabric 260, and a downstream port bidirectionally connected to memory controller 271.

Figure 3:
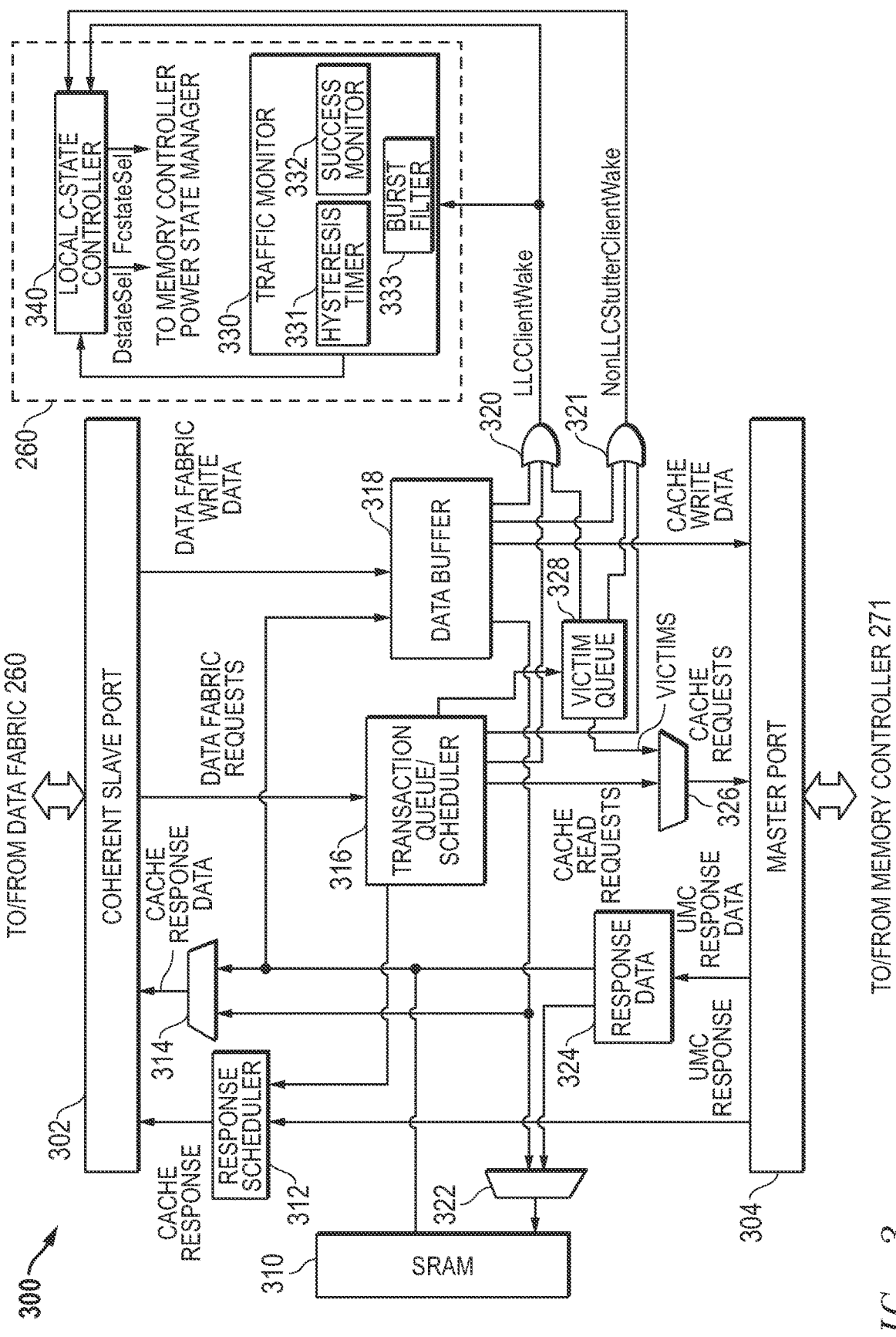
FIG. 3 shows a portion of a system-on-chip including an implementation of a last level cache of FIG. 2 according to some embodiments.

FIG. 3 shows a portion of an SOC including an implementation of a last level cache 300 of FIG. 2 according to some embodiments. LLC 300 generally includes a coherent slave port interface 302, a coherent master port 304, an SRAM memory 310, a response scheduler 312, a multiplexer 313, a transaction queue and scheduler 316, a write data buffer 318, an OR gate 320, an OR gate 321, a multiplexer 322, a response data port 324, a multiplexer 326, a victim queue 328. Also shown are a traffic monitor 330 and local C-state controller 340 of data fabric 260.

Coherent slave port interface 302 is bidirectionally connected to a coherent slave controller of data fabric 260, which receives memory access requests and write data from data fabric 260 and provides memory access responses and read data to data fabric 260.

Write data buffer 318 has an input connected to coherent slave port 302, a first output connected to multiplexer 314, a second output connected to multiplexer 322, and a third output connected to coherent master port 302, a third output connected to OR gate 320, and a fourth output connected to OR gate 321. Write data buffer 318 receives and stores data from data fabric 260 over coherent slave port 302 where it is held until either the data is sent to SRAM 310 through multiplexer 322 as a portion of a cache entry, or the data is sent to main memory over the master port 304 to the memory controller, or the data is returned through multiplexer 314 to a memory accessing agent over coherent slave port 302 through data fabric 260. Data buffer 318 also asserts a signal to an input of OR gate 320 when data buffer 318 has LLC cacheable traffic for the volatile memory, and asserts a signal to an input of OR gate 321 when data buffer 318 has traffic not cacheable by LLC 330 for the volatile memory, as further discussed below.

Response data port 324 has an input connected to coherent master port 302, a first output connected to multiplexer 314, and a second output connected to multiplexer 322. Response data port 324 receives and stores data from memory controller 271 over master port 304 where it is held until the data is sent to SRAM 310 through multiplexer 322 as a portion of a cache entry, and/or the specifically accessed portion of the data is sent through multiplexer 314 to a data accessing agent over coherent slave port 302 through data fabric 260.

Response scheduler 312 has a first input connected to coherent master port 304, a second input connected to transaction queue and scheduler 316, and an output connected to coherent slave port 302. Response scheduler 312 is used to forward responses received from memory controller 271 over master port 304 to a data accessing agent over coherent slave port 302 through data fabric 260, as well as for interfacing to a transaction queue/scheduler 316 to receive reads that are allocated to the cache.

Transaction queue and scheduler 316 has an input connected to coherent slave port 302, a first output connected to response scheduler 312, a second output connected to victim queue 328, and a third output connected to multiplexer 326, a fourth output connected to OR gate 320, and a fifth output connected to OR gate 321. Transaction queue and scheduler 316 generally coordinates the memory access requests in cache 300. In this embodiment, transaction queue and scheduler 316 is implemented as a shifting-collapsing queue that handles most requests serviced by cache 300. An incoming memory access request over coherent slave port 302 from data fabric 260, or internal requests such as victim requests, flushed data, and rinsed data, allocate a new entry in transaction queue/scheduler 316. Transaction queue/scheduler 316 has several different engines that scan for operations to pick every cycle. For example, there are two victim line pickers that look for the least-recently used (LRU) cache lines, and use victim queue 328 to stage memory locations to write back to main memory through multiplexer 326 and coherent master port 304. There is a tag read and lookup picker that picks tag read and tag lookup operations for SRAM 310. Similarly, there is a tag write and lookup picker that picks tag write operations for SRAM 310. A data read picker and a data write picker pick data reads or data writes, respectively, for SRAM 310. Finally, a memory controller picker picks reads and writes for the memory controller 271 through the master port. Transaction queue/scheduler 316 supports up to two allocations and two deallocations per internal clock cycle. Transaction queue/scheduler 316 also asserts a signal to an input of OR gate 320 when transaction queue/scheduler 316 has LLC cacheable traffic for the volatile memory, and asserts a signal to an input of OR gate 321 when transaction queue/scheduler 316 has traffic not cacheable by LLC 330 for the volatile memory, as further discussed below.

Victim queue 328 has an input connected to transaction queue/scheduler 316, an connected to OR gate 320, and an output connected to OR gate 321. Traffic monitor 300 is generally connected to LLC 300 for monitoring traffic directed to coherent master port 304 to memory controller 271 and its connected volatile memory such as LPDDRx SDRAMs 273. Traffic directed to master port 304, in this implementation, is monitored at each of data buffer 318, transaction queue/scheduler 316, and victim queue 328. In other implementations, the traffic may be monitored elsewhere, for example at an output buffer of master port 304. The monitoring is employed to provide a power saving feature that is able to put the volatile memory in a self-refresh state when traffic to the volatile memory is idle, even during conditions in which data fabric 260 is not in a C-state or otherwise idle. OR gate 320 asserts an "LLCClientWake" signal whenever any of data buffer 318, transaction queue/scheduler 316, and victim queue 328 signal at their respective outputs that they have last level cache client traffic to the volatile memory. "Non-LLC stuttering clients" are stuttering client traffic not serviced by the last level cache. OR gate 321 asserts a "NonLLCStutterClientWake" signal whenever any of data buffer 318, transaction queue/scheduler 316, and victim queue 328 signal at their respective outputs that they have Non-LC stuttering client traffic not serviced by the last level cache for the volatile memory.

Traffic monitor 300 has a first input receiving the LLCClientWake signal from OR gate 320, and an output connected to local C-state controller 340. Other inputs (not shown) may be included to receive C-state configuration information from local C-state controller 340.

Local C-state controller 340 of data fabric 260 controls the C-states for data fabric 260 and includes various port monitors and control outputs that are not shown. Local C-state controller 340 has an input connected to traffic monitor 340, an input receiving the LLCClientWake signal from OR gate 320, an input receiving the NonLLCStutterClientWake signal from OR gate 321, an output providing a signal "DstateSel" to the memory controller power state manager, and an output providing a signal "FcStateSel" to the memory controller power state manager.

In operation, traffic monitor 330, based on detecting an idle condition in the monitored traffic, signals to local C-state controller 340 to cause the memory controller to command the volatile memory to leave the self-refresh mode responsive to a cache miss or an eviction at last level cache 330. The signal NonLLCStutterClientWake is used to indicate to local C-state controller 340 that traffic from a stuttering client that is not cached at LLC 300 requires access to the volatile memory over coherent master port 304, and the signal LLCClientWake is used to indicate to traffic monitor 330 and to local C-state controller 340 that traffic from a non-stuttering (normal) memory client requires access to the volatile memory. In this implementation, traffic monitor 330 is trained and operates by monitoring traffic only from LLC clients in this embodiment. Some stuttering clients may have their traffic cached at LLC 300, and so traffic from such clients does not cause the signal NonLLCStutterClientWake to be asserted. A non-stuttering client is a client that attempts to empty its outgoing buffer and/or fill its incoming buffer as soon as any entries are present. For example, CCX 220 is a non-stuttering client. On the other hand, a stuttering client is a client that gathers a certain number of memory access requests before attempting to send them in one burst. The most common stuttering clients are display controllers or other multimedia clients that may be embodied as RT clients 242 and 243 (FIG. 2). Prior to the data fabric entering a C-state or the memory controller entering a preemptive C-state, stuttering clients have full access to memory and can generate traffic freely. When the memory controller enters a C-state, non-LLC cacheable stuttering clients need to enter stutter mode in which these stutter clients accumulate memory traffic and send it in bursts. When the data fabric is in a C-state, the buffer at a stuttering client is filled up, and then drained to a watermark level by requesting the data fabric to restore access to memory.

To detect the idle traffic condition based on its input signals, traffic monitor 330 further uses a success monitor circuit 332 that detects an idle condition in response to either the traffic to volatile memory through coherent master port 304 being idle for a period of time determined by hysteresis timer 331, or a prediction that a next traffic idle period will last longer than a designated threshold. Success monitor circuit 342 works in conjunction with burst filter 333 to filter "noisy" traffic that lasts for only a short duration after traffic resumes, and thereby to avoid a distortion in the next traffic idle prediction. In some embodiments, success monitor circuit is trained to make the prediction using only non-stuttering traffic between the last level cache and the memory controller.

In this implementation, in addition to entering the self-refresh state at the volatile memory, local C-state controller 340 is further operable to cause memory controller to enter a selected C-state based on traffic monitor 330 detecting the idle condition. The selected C-state including the data fabric and last level cache maintaining an operational power state, as further described below. The signals DstateSel and FcStateSel are employed to, based on traffic monitor 330 detecting an idle condition in the monitored traffic, cause the memory controller to command the volatile memory to enter self-refresh mode while the last level cache maintains an operational power state and responds to cache hits over the data fabric. Specifically, signal DstateSel is used to select the memory controller power state, including a light and normal C-states as described with respect to FIG. 4, which may be one of the two "preemptive" C-states which include the memory controller 271 in a C-state, with the volatile memory in self-refresh mode, while the data fabric is not yet placed in a C-state. Signal FcStateSel is used to set a clock power state for the memory controller operating clock.

Victim queue 328 is able to assert the LLCClientWake signal through OR gate 320 to signal to traffic monitor 330 and local C-state controller 340 that it needs access to the volatile memory for a client cacheable at LLC 330. Victim queue 328 is also able to assert the NonLLCStutterClientWake signal through OR gate 321 to signal to local C-state controller 340 that is not cacheable at LLC 330. In this embodiment, victim queue 328 includes a high/low watermark feature which is used to arbitrate traffic to the volatile memory through coherent master port 304 from victim queue 328 and transaction queue and scheduler 316. For the self-refresh control provided by traffic monitor 330 to work more efficiently in conjunction with the watermark feature, a process is needed to flush victim queue 328 when there are no pending reads in order to avoid unnecessarily long LLCClientWake assertion from victims sitting in the queue waiting to reach a watermark. Once victim queue 328 is flushed, it deasserts LLCClientWake, allowing traffic monitor 330 to detect the traffic idleness at coherent master port 304 so that if the traffic sufficiently idle, traffic monitor 330 can initiate a preemptive self-refresh entry. When the transaction queue of transactional queue and scheduler 316 is truly idle, victim queue 328 will drain immediately irrespective of its watermark level and occupancy. However, if there are transactions in the transaction queue, victim queue 328 yields to the transaction queue and accumulates pending transactions until its occupancy reaches the watermark. To handle such pending transactions, when the volatile memory is not in self refresh, victim queue 328 asserts the LLCClientWake signal whenever it is populated, and last level cache 300 will disregard the threshold scheme to opportunistically flush victim queue 328 when reads are not pending. When the volatile memory is in self-refresh, victim queue 328 asserts LLCClientWake only upon reaching the same threshold, in order to allow the extend the duration of self refresh by allowing victim queue to buffer up victims evicted by write allocations. This behavior allows last level cache 300 to delay exit from the self-refresh mode by perform a certain number of eviction operations without causing the volatile memory to exit the self-refresh mode, instead employing available space in the victim queue until it becomes necessary to exit self-refresh to drain victim queue 328. As further described below, this feature functions to delay exit from the self-refresh mode whenever the self-refresh mode is active, whether it was entered preemptively, or entered based on the normal entry process as directed by local C-state controller 240 of data fabric 260.

In some embodiments, a similar watermark feature may be used with data buffer 318 to delay exit from the self-refresh mode.

In this embodiment, last level cache 300 also multiple modes of operation to improve the total power saving achievable with the self-refresh feature. Specifically, last level cache 300 is controllable to operate in a first high performance mode or a second low performance mode in which at least one feature is disabled to increase the likelihood of the traffic monitor detecting an idle condition. Features that may be disabled in the second low performance mode include pre-fetching, speculative memory reads, and conditional write through/rinsing features.

FIG. 4 shows a table 400 showing the correspondence between different data fabric idle states and the states of other components of SOC 210 of FIG. 2. Table 400 includes a first row describing a "light-weight" C-state 410 for data fabric 260 labeled "DFC1", a second row describing a "traditional" C-state 420 for data fabric 260 labeled "DFC2", a third row describing a "preemptive light-weight" C-state 430 for memory controller 271 only labeled "UMC Preemptive C1", and a fourth row describing a "preemptive traditional" C-state for memory controller 271 only labeled "UMC Preemptive C2". Chart 400 includes seven columns including a "C-state" column, a memory controller column labeled "UMC", a physical interface controller column labeled "PHY", a volatile memory column labeled "DRAM", memory controller clock column labeled "UMC CLK" in which UMC CLK refers to the memory controller's clock source, and data fabric a clock column labeled "DF CLK" in which the DF CLK refers to the data fabric's clock source.

DFC2 corresponds a traditional C-state in which both the power and clock are gated for data fabric 260. Since DFC2 requires significant wake-up latency for data fabric 260, DFC2 also performs power and clock gating for the data fabric and memory controller, and additionally places the memory PHY into a low power state with its PLL off, a state designated LP2. Before power- and clock-gating these components, however, the memory is placed into self-refresh mode to preserve its contents during the expected long residency in DFC2. In addition, the data fabric's and memory controller's PLL(s) is powered down and the output is bypassed to the reference clock REFCLK. UMC Preemptive C1 corresponds to a light-weight C-state for the memory controller in which the memory controller is in the same condition as DFC1, while the data fabric (including the last level cache) is operational, and UMC Preemptive C2 corresponds to a traditional C-state for the memory controller in which the memory controller is in the same condition as DFC2, with the data fabric (including the last level cache) operational.

As noted above, data fabric 260 includes a lightweight C-state DFC1. To reduce wakeup latency to accommodate, e.g., real-time peripherals, DFC1 only clock gates data fabric 260 and the memory controller's clock source(s), and additionally keeps the memory PHY powered on with the data fabric's and memory controller's PLL(s) remaining locked. Before clock-gating these components, however, the memory is placed into self-refresh mode to preserve its contents during an indeterminate residency in DFC1, and the data fabric's and memory controller's PLL(s) is not powered off but placed into the lower latency deep sleep mode. Thus, the data fabric provides a lightweight idle state DFC1 that provides lower latency to allow real-time peripherals, such as an image sensor processor, the ability to periodically access the memory system. Traffic monitor 300 of FIG. 3 operates in conjunction with the depicted scheme in order to allow the volatile memory (typically a DRAM) to save additional power by entering the self-refresh state, in the preferred implementation one of the two preemptive C-states of rows 430 and 440, even when a data fabric C-state is not active, as further described below.

Figure 5:
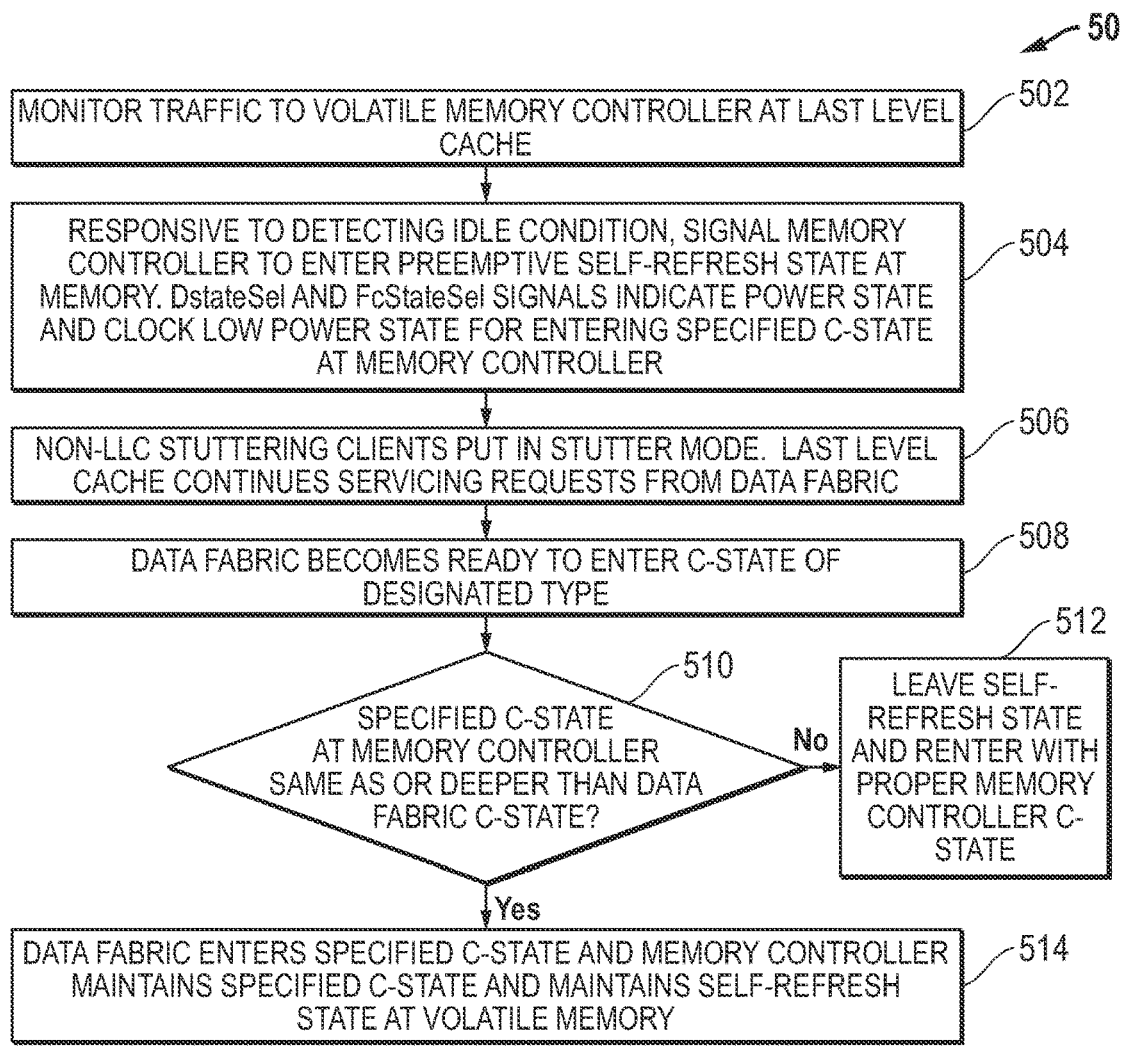
FIG. 5 shows a flowchart of a process for operating a memory system including a last level cache with a traffic monitor such as traffic monitor of FIG. 3 according to some embodiments.

FIG. 5 shows a flowchart 500 of a process for operating a memory system including a last level cache with a traffic monitor such as traffic monitor 300 of FIG. 3 according to some embodiments. The depicted process is suitable for use with the last level cache and traffic monitor of FIG. 3, or other suitable embodiments. The process begins at block 502 where it monitors traffic between the last level cache and the volatile memory controller, for example by using the monitoring signals and circuitry of FIG. 3, to detect an idle condition. The idle condition detected, as discussed above, applies only to last level cache client traffic idleness, and that non-LLC stuttering client traffic to DRAM is expected to be present at this point. At block 504, responsive to detecting an idle condition, the process causes a memory controller to command the volatile memory to enter self-refresh mode while the last level cache maintains an operational power state and responds to cache hits over the data fabric. In this embodiment, the process also signals the memory controller with the signal DstateSel to indicate a desired power state selected from one of the two preemptive C-states of FIG. 4, and signals the memory controller with the signal FcStateSel to indicate a desired clock low power state. The desired future states are preferably configured by the data fabric's power state controller to be consistent with the C-states expected to be used at the data fabric. For example, if the data fabric was most recently in the DFC1 power state, that state can be the expected state to be used next at the data fabric, and so the desired power state for a preemptive C-state at the memory controller is UMC Preemptive C1 power state, which includes the same conditions at the memory controller At block 506, non-LLC serviced stuttering clients are put into stutter mode, and then the last level cache is able to continue servicing memory access requests from remaining clients over the data fabric while the memory controller is in a preemptive C-state with the volatile memory in the self-refresh mode. (Operations causing accesses to the volatile memory at this point in the process will cause an exit from the self-refresh mode, as further described with respect to FIG. 6 and FIG. 7). Generally, prior to the data fabric entering a C-state or the memory controller entering a preemptive C-state, stuttering clients have full access to memory and can generate traffic freely. When the memory controller enters a C-state at block 504, non-LLC cacheable stuttering clients need to enter stutter mode in which these stutter clients accumulate memory traffic and send it in bursts. When the data fabric is in a C-state, the buffer of a stuttering client is filled up, and then drained to a watermark level by requesting the data fabric to restore access to memory. This feature is also used in combination with the preemptive memory controller C-state entered in 504. Even though the data fabric is not yet in a C-state, stutter clients are put in stutter mode.

In the depicted scenario, at block 508 becomes ready to enter a C-state of a designated type, for example one of the C-states shown in FIG. 4. At block 510, the process determines if the C-state to be entered by the data fabric matches that already specified for the memory controller, or is a lighter C-state than that specified for the memory controller. In most operating conditions, the states will match. However, if traffic conditions have changed at the data fabric, it is possible they will not match. If the memory controller C-state matches or is deeper than the data fabric, the memory controller has already incurred the delay of entering a state as least as deep as required, and the process goes to block 514. If the memory controller C-state is lighter than that of data fabric 260 (the data fabric C-state is deeper) at block 510, the process goes to block 512 where it causes the memory controller to the leave the current C-state, including the volatile memory leaving the self-refresh state, and re-enter the self-refresh state when the memory controller enters the C-state used at the data fabric. If the specified low power states at the memory controller match those required by the C-state of the data fabric, the process goes to block 514 where the memory controller enters the specified C-state conditions without causing the memory to leave the self-refresh state. Because non-LLC stuttering clients would have already been put into stutter mode earlier (block 504), the data fabric C-state entry does not need to separately put these clients into stutter mode as it normally does when entering a data fabric C-state from an active state instead of the preemptive memory controller C-state.

The depicted process has the advantage that it allows for use of small and efficient finite state machine logic in the power state controller of the memory controller, while still allowing variability in both the memory controller and memory PHY C-state conditions, together with the more frequent memory self-refresh state controlled by traffic monitor 300.

Figure 6:
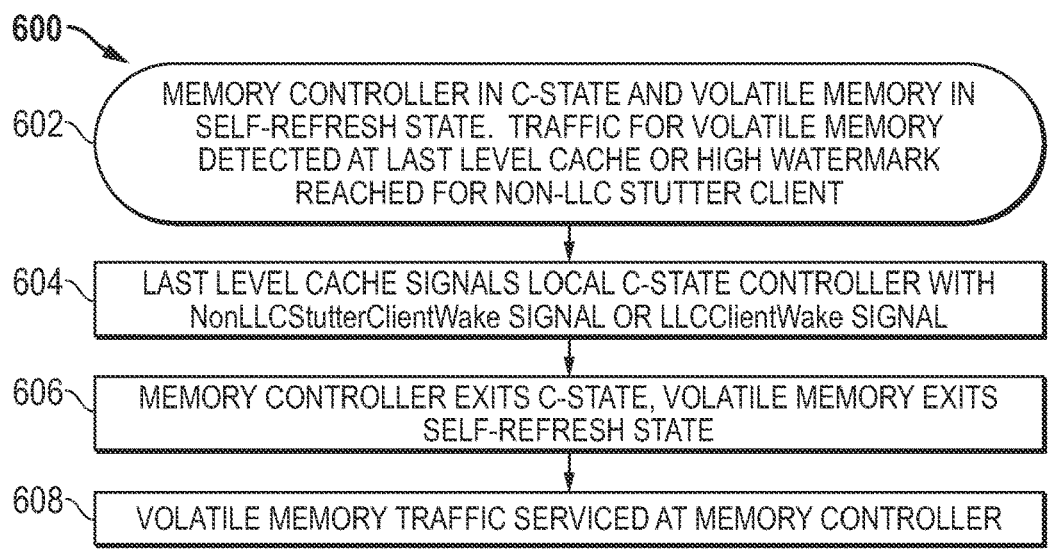
FIG. 6 shows a flowchart 600 of a process for leaving the self-refresh state while memory controller is not yet in a C-state according to some embodiments.

FIG. 6 shows a flowchart 600 of a process for leaving the self-refresh state while memory controller is in a C-state according to some embodiments. The depicted process is suitable for use with the last level cache and traffic monitor of FIG. 3, or other suitable embodiments. At block 602, the process detects traffic to the volatile memory at the last level cache during the self-refresh state, with the memory controller in a preemptive C-state such as one of the two preemptive C-states in FIG. 4, with the data fabric and last level cache operational. Such traffic may be caused by last level cache clients that were previously only hitting the cache, or by non-LLC stuttering clients reaching their stutter watermark level and requiring access to the volatile memory to fill or flush their data buffers. At block 604, the process signals the traffic monitor with either the NonLLCStutterClientWake signal or the LLCClientWake signal, depending on the type of traffic involved. At block 606, the traffic monitor signals the power state controller of the memory controller to exit the C-state and to bring the volatile memory out of the self-refresh state. At block 608 the volatile memory traffic is then sent from the last level cache to the memory controller and serviced by the memory controller.

Figure 7:
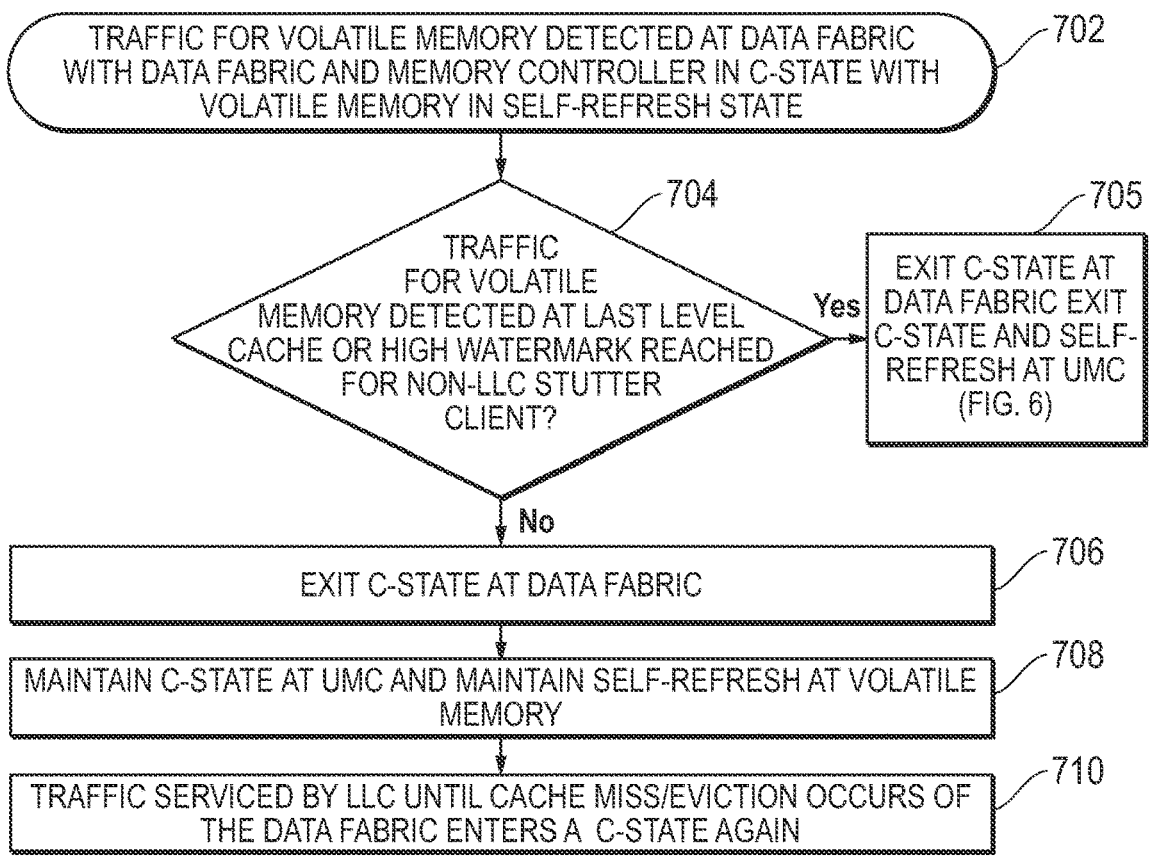
FIG. 7 shows a flowchart of a process for exiting a C-state at the data fabric including a delayed C-state exit at the memory controller according to some embodiments.

FIG. 7 shows a flowchart 700 of a process for exiting a C-state at the data fabric including a delayed C-state exit at the memory controller according to some embodiments. The depicted process is suitable for use with the traffic monitor of FIG. 3, and other suitable traffic monitor circuits employed with a last level cache. The process begins at block 702 with the data fabric and memory controller in a C-state or low power state, such as either of states DFC1 or DFC2 of FIG. 4. Traffic for the volatile memory is detected at the data fabric, typically by a separate traffic monitor which monitors master ports connecting the data fabric to various system clients such as CPU, GPU, and real-time clients.

At block 704, the process determines whether the traffic is from a client that is not caching at the last level cache, referred to as non-LLC serviceable traffic. If so, the process goes to block 704 where it exits the C-state at the data fabric, and exits the C-state at the memory controller including exiting the self-refresh mode at the volatile memory. If not, the process goes to block 706 where it exits the C-state at the data fabric. For example, for embodiments supporting the C-states depicted in FIG. 4, this block goes from one of the C-states 410 or 420, to one of the C-states 430 or 440. As shown at block 708, the C-state at the data fabric is maintained, including maintaining the self-refresh state at the volatile memory. At block 710, this state continues with cacheable traffic serviced by the LLC until access to the volatile memory is required, or until the data fabric again becomes idle and is put into a C-state. As shown, a cache miss or eviction at the last level cache requires access to the volatile memory. As can be understood, this depicted process has the advantage of delaying the memory controller leaving its C-state, allowing the last level cache to service all the memory requests it is able to, until a memory request that requires access to the volatile memory occurs. The depicted process also allows the data fabric to leave a C-state and reenter that C-state without the memory controller ever leaving its C-state, if a scenario occurs for which all the traffic can be serviced by the LLC with no traffic requiring access to the volatile memory. Both of these scenarios provide significant power savings by avoiding an exit of the memory controller C-state and the memory self-refresh state until it is absolutely necessary.

Figure 8:
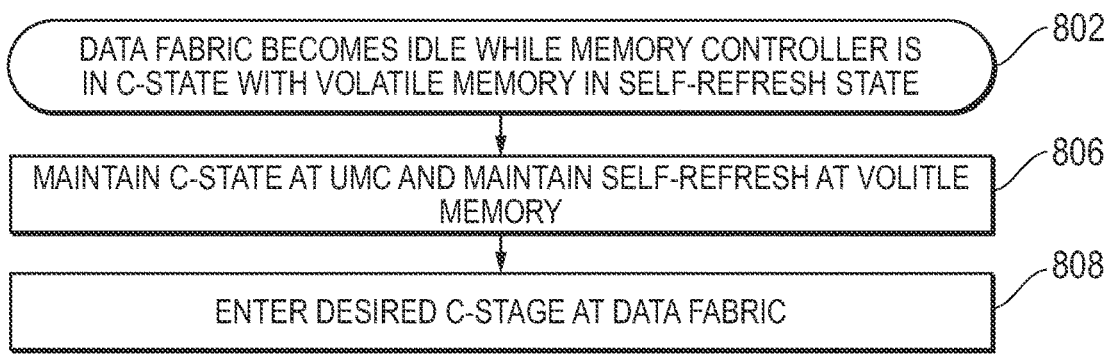
FIG. 8 shows a flowchart of a process for entering a data fabric C-state with the memory controller in a preemptive C-state according to some embodiments.

FIG. 8 shows a flowchart 800 of a process for entering a data fabric C-state with the memory controller in a preemptive C-state according to some embodiments. The depicted process is suitable for use with the traffic monitor of FIG. 3, and other suitable traffic monitor circuits employed with a last level cache. The process begins at block 802 where the data fabric becomes idle while the memory controller is in a C-state with the volatile memory in a self-refresh state. For example, in embodiments supporting the C-states of FIG. 4, the memory controller is in one of the preemptive C-states 430 or 440. Next at block 804, the process maintains the C-state at the memory controller, including the self-refresh state at the volatile memory. If the C-state at the memory controller is lighter than the desired C-state for the data fabric, this block will include putting the memory controller into a deeper C-state, which may include exiting the current and re-entering the deeper C-state as discussed with respect to FIG. 5. At block 806 the data fabric enters the desired C-state. This process represents a change from one of states 430 or 440, to one of states 410 or 420 (FIG. 4).

Figure 9:
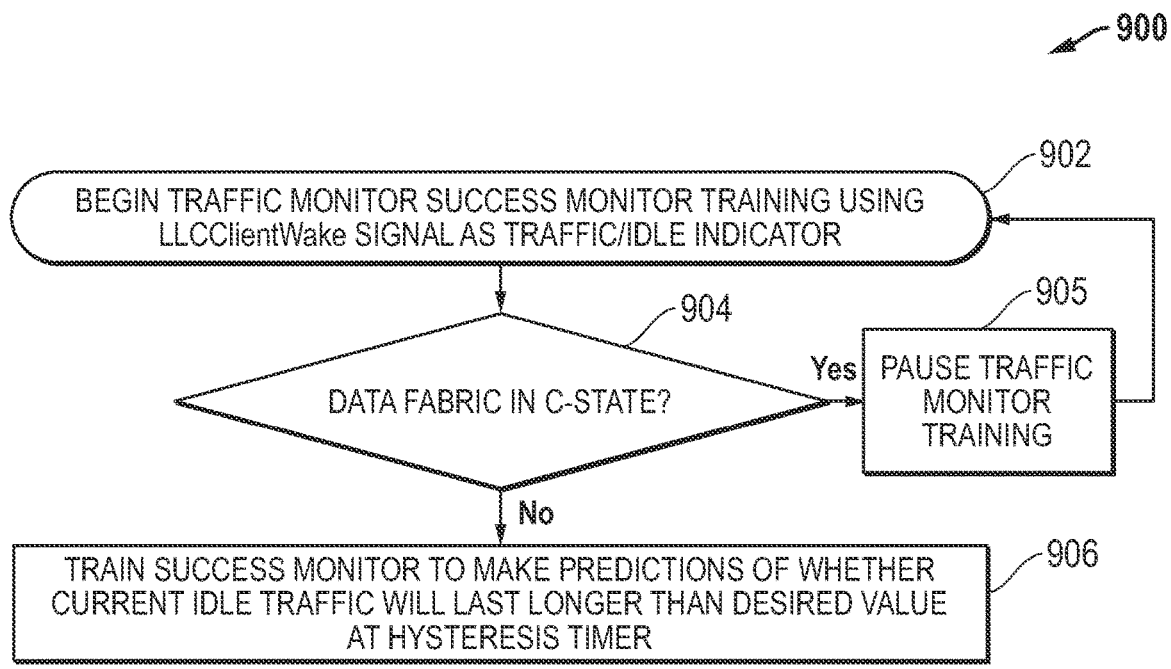
FIG. 9 shows a flowchart of a process for training a success monitor of a traffic monitor according to some embodiments.

FIG. 9 shows a flowchart 900 of a process for training a success monitor of a traffic monitor according to some embodiments. The depicted process is suitable for use with the traffic monitor of FIG. 3, and other suitable traffic monitor circuits employed with a last level cache. The process begins training the success monitor at block 902. Traffic periods with non-stuttering traffic to the volatile memory through the memory controller are used for the training based on the LLCClientWake signal, and traffic from non-LLC serviceable stuttering traffic is not used for the training. At block 904, if the data fabric becomes idle and is put into a C-state, the process goes to block 905 where it pauses training the traffic monitor. When the data fabric is not idle, whether or not the memory controller is in the pre-emptive C-state, the process continues to block 906 where it trains the success monitor to make a prediction of whether a current idle traffic period will last longer than a desired value at the hysteresis timer. As can be understood, while the flowchart shows a series of steps, the training process may be ongoing and controlled in an event-driven fashion with stutter traffic interrupting the training.

In the embodiment of FIG. 3, stuttering traffic is not cached at last level cache 300 and because of its period nature is not helpful for training success monitor 332. However, in other embodiments caching of stuttering traffic may be allowed at last level cache 300. In such embodiments, training may occur with stuttering traffic if the traffic is provided caching at the last level cache.

Figure 10:
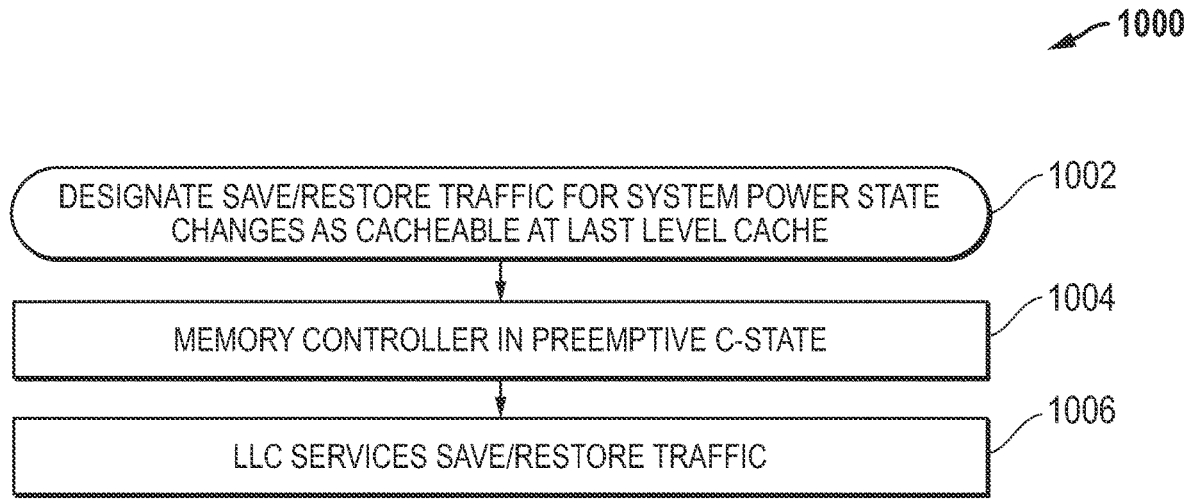
FIG. 10 shows a flowchart of a process for handling save/restore traffic from designated system modules at a last level cache according to some embodiments.

FIG. 10 shows a flowchart 1000 of a process for handling save/restore traffic from designated subsystem at a last level cache according to some embodiments. The depicted process is suitable for use with the traffic monitor of FIG. 3, and other suitable traffic monitor circuits employed with a last level cache. At block 1002, the process designates save/restore traffic for certain subsystem power state changes as cacheable at the LLC. Preferably, this designation is done by setting a memory address range used for the save/restore traffic as cacheable by the LLC. The save/restore traffic designated as such can be, for example, traffic for transitioning the data fabric into and out of a sleeping state or a C-State such as those discussed above. Traffic for transitioning any other subsystem or module into and out of sleep states may be designated as cacheable by the LLC in some embodiments.

At block 1004, the memory controller is in a preemptive C-state as described above. In such condition, at block 1006, the LLC is able to service the save/restore traffic that has been designated as cacheable at the LLC. Use of the depicted process has the advantage of saving power by avoiding bringing the memory controller out of a C-state, and the volatile memory out of self-refresh, to service selected save and restore traffic.

SOC 210 of FIG. 2 or any portions thereof, such as last level cache 300 and traffic monitor 330, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. The various techniques used in conjunction with the retention low power state for the probe filter disclosed herein can be used independently or in conjunction with the other techniques. Moreover, different techniques and circuits can be used to detect the conditions responsive to which the retention low power state is entered.

Accordingly, it is intended by the appended claims to cover all modifications of the disclosed embodiments that fall within the scope of the disclosed embodiments.

What is claimed is:

1. A data processor comprising:
    a data fabric for routing requests between a plurality of requestors and a plurality of responders;
    a memory controller for accessing a volatile memory;
    a last level cache coupled between the memory controller and the data fabric and including a cache memory separate from the volatile memory; and
    a traffic monitor coupled to the last level cache and operable to monitor traffic between the last level cache and the memory controller to and from the volatile memory, and based on detecting an idle condition in the monitored traffic, cause the memory controller to command the volatile memory to enter self-refresh mode, wherein the traffic monitor is further operable to cause the memory controller to enter a selected C-state based on detecting the idle condition, the selected C-state including the data fabric and last level cache maintaining an operational power state.

2. The data processor of claim 1, wherein the last level cache maintains an operational power state and responds to cache hits over the data fabric during a time in which the volatile memory is in the self-refresh mode caused by the traffic monitor.

3. The data processor of claim 1, wherein the traffic monitor is further operable to cause the memory controller to command the volatile memory to leave the self-refresh mode responsive to a cache miss or an eviction at the last level cache.

4. The data processor of claim 1, wherein the traffic monitor comprises:
    a hysteresis timer; and
    a success monitor circuit coupled to the hysteresis timer that detects the idle condition based on idle traffic between the last level cache and the memory controller until an expiration of the hysteresis timer, or a prediction that a next traffic idle period will last longer than a threshold.

5. The data processor of claim 4, wherein the success monitor circuit is trained to make the prediction using only traffic serviceable by the last level cache.

6. The data processor of claim 1, wherein the last level cache selectively operates in a high performance mode and a low performance mode in which at least one feature is disabled to increase a likelihood of the traffic monitor detecting the idle condition.

7. The data processor of claim 1, wherein:
    the last level cache includes a victim queue;
    the last level cache operates to opportunistically flush the victim queue when the volatile memory is not in the self-refresh mode; and
    the last level cache operates to allow the victim queue to fill to a designated threshold when the volatile memory is in the self-refresh mode in order to delay exit from the self-refresh mode.

8. The data processor of claim 1, wherein the traffic monitor causes the memory controller to enter a selected C-state based on detecting the idle condition by signaling a local power state controller of the data fabric to indicate that the memory controller is idle.

9. The data processor of claim 8, wherein:
the last level cache signals the traffic monitor with a first signal to indicate that non-stuttering traffic requires access to the volatile memory; and the last level cache signals the local power state controller of the data fabric with the first signal, and with a second signal to indicate that stuttering traffic requires access to the volatile memory.

10. A method comprising:
at a data fabric of a data processor, routing requests between a plurality of requestors and a plurality of responders;
at a last level cache coupled to the data fabric, monitoring traffic to a volatile memory separate from a cache memory of the last level cache;
based on detecting an idle condition in the monitored traffic, causing a memory controller to command the volatile memory to enter self-refresh mode;
at the last level cache, producing a first signal to indicate that non-stuttering traffic requires access to the volatile memory; and
at the last level cache, producing a second signal to indicate that stuttering traffic requires access to the volatile memory.

11. The method of claim 10, further comprising maintaining an operational power state at the last level cache for responding to cache hits over the data fabric during a time in which the volatile memory is in the self-refresh mode caused based on detecting the idle condition in the monitored traffic.

12. The method of claim 10, further comprising commanding the volatile memory to leave the self-refresh mode responsive to a cache miss or an eviction at the last level cache.

13. The method of claim 10, further comprising detecting the idle condition based on idle traffic between the last level cache and the memory controller until an expiration of a hysteresis timer, or a prediction that a next traffic idle period will last longer than a threshold.

14. The method of claim 13, further comprising training a success monitor circuit to make the prediction using only traffic serviceable by the last level cache.

15. The method of claim 10, further comprising:
designating save/restore traffic for at least one subsystem of the data processor as cacheable at the last level cache; and
servicing save/restore traffic for the at least one subsystem at the last level cache while the volatile memory is in the self-refresh mode.

16. The method of claim 10, further comprising opportunistically flushing a victim queue of the last level cache when the volatile memory is not in the self-refresh mode.

17. The method of claim 16, further comprising allowing the victim queue to fill to a designated threshold when the volatile memory is in the self-refresh mode in order to delay exit from the self-refresh mode.

18. A traffic monitor for a last level cache, comprising:
a traffic monitor circuit for monitoring traffic between the last level cache and a memory controller to and from a volatile memory separate from a cache memory of the last level cache, and based on detecting an idle condition in the monitored traffic, causing the memory controller to command the volatile memory to enter self-refresh mode, wherein the traffic monitor is further operable to cause the memory controller to enter a selected C-state based on detecting the idle condition, the selected C-state including a data fabric and last level cache maintaining an operational power state,
wherein the last level cache maintains an operational power state and responds to cache hits over the data fabric while the volatile memory is in the self-refresh mode.

19. The traffic monitor of claim 18, wherein the traffic monitor circuit is further operable to cause the memory controller to command the volatile memory to leave the self-refresh mode responsive to a cache miss or an eviction at the last level cache.

* * * * *